United States Patent [19]

Lim

[11] Patent Number: 5,227,232
[45] Date of Patent: Jul. 13, 1993

[54] CONDUCTIVE TAPE FOR SEMICONDUCTOR PACKAGE, A LEAD FRAME WITHOUT POWER BUSES FOR LEAD ON CHIP PACKAGE, AND A SEMICONDUCTOR DEVICE WITH CONDUCTIVE TAPE POWER DISTRIBUTION

[76] Inventor: Thiam B. Lim, 39 Elias Road, #02-04 Pasir Ris Gardens, Singapore 1851, Singapore

[21] Appl. No.: 644,729

[22] Filed: Jan. 23, 1991

[51] Int. Cl.$^5$ .......................... B32B 7/12; H01L 23/48
[52] U.S. Cl. .................................... 428/344; 428/354; 257/668; 257/670
[58] Field of Search .................. 357/68, 70; 428/344, 428/354; 257/668, 670

[56] References Cited

U.S. PATENT DOCUMENTS

| | | | |
|---|---|---|---|
| 4,727,221 | 2/1988 | Saitou et al. | 428/344 |
| 4,862,245 | 8/1989 | Pashby | 357/70 |
| 4,916,519 | 4/1990 | Ward | 357/70 |
| 4,965,654 | 10/1990 | Karner et al. | 357/70 |
| 5,032,895 | 7/1991 | Horiuchi et al. | 357/70 |
| 5,091,251 | 2/1992 | Sakumoto et al. | 428/354 |

Primary Examiner—Edward Wojciechowicz
Attorney, Agent, or Firm—Robby T. Holland; Lawrence J. Bassuk; Richard L. Donaldson

[57] ABSTRACT

A conductive tape for a packaged semiconductor device is disclosed. The tape contains a first adhesive layer, a base film on top of the first adhesive layer, a conductive layer on top of the base film layer, and a second adhesive layer on top of the conductive layer. Metal may form the conductive layer. The tape may have slits, slots, or apertures in it so that electrical connection may be made to the conductive layer. Such a tape is useful in lead on chip integrated circuit packages to connect the semiconductor die to the lead frame and to function as a power supply bus by transferring power to the semiconductor die. Wire bonds extending through slots in the second adhesive layer form electrical connection from the lead fingers for receiving power to the conductive layer of the tape. Wire bonds extending from the bonding pads of the semiconductor die through slots the second adhesive layer form electrical connection from the semiconductor die to the conductive layer.

5 Claims, 5 Drawing Sheets

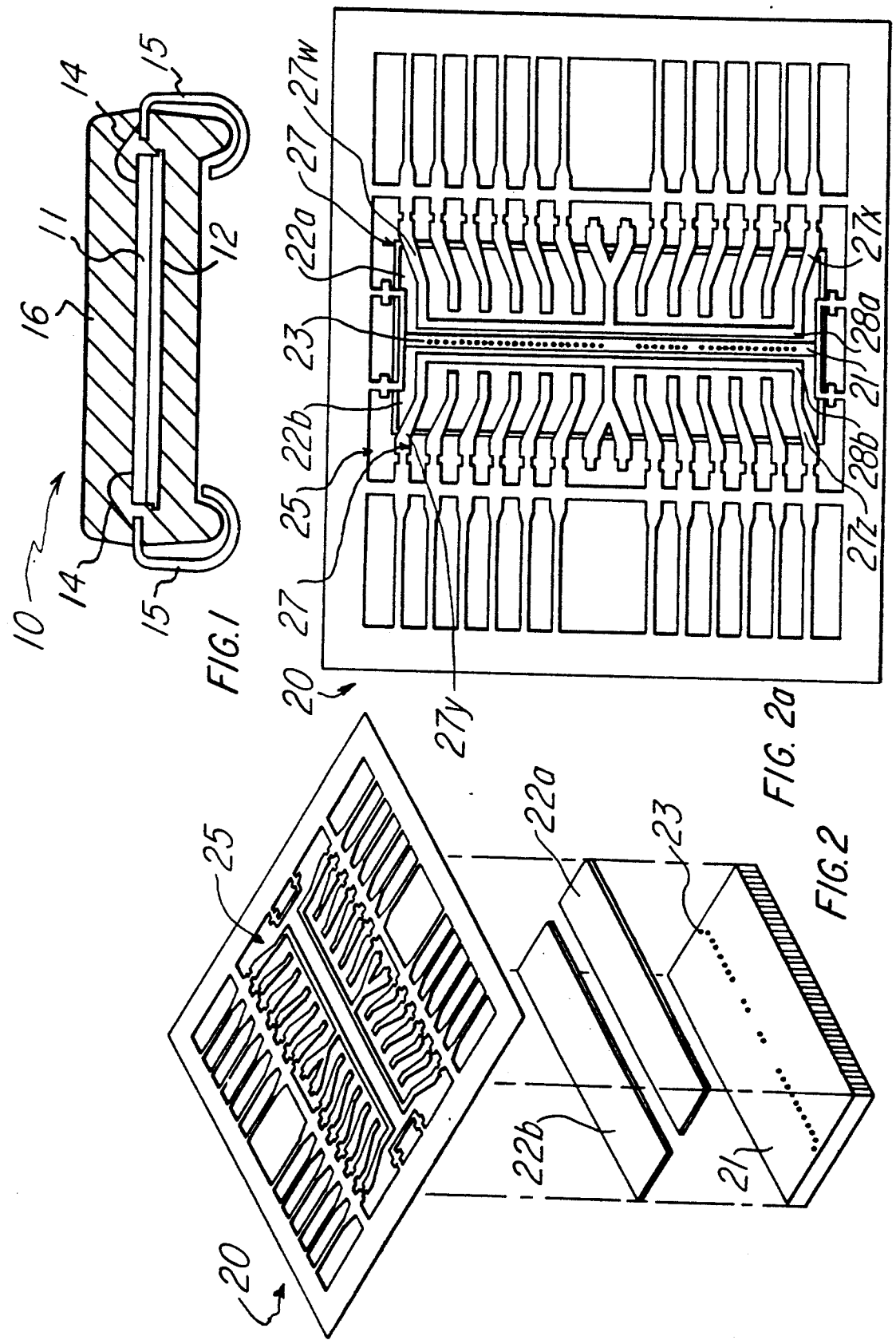

CONDUCTIVE TAPE FOR SEMICONDUCTOR PACKAGE, A LEAD FRAME WITHOUT POWER BUSES FOR LEAD ON CHIP PACKAGE, AND A SEMICONDUCTOR DEVICE WITH CONDUCTIVE TAPE POWER DISTRIBUTION

FIELD OF THE INVENTION

This invention relates to integrated circuits, and more particularly to tapes used in integrated circuitry packaging.

BACKGROUND OF THE INVENTION

An integrated circuit packaged device generally includes an integrated circuit chip lying on a chip support pad. Wire bonds connect the IC to a lead frame. A substance, such as plastic, encapsulates the structure. The plastic small outline J lead (PSOJ) package is one exemplary example. For application, one technique uses reflow solder to surface mount the IC package to a printed circuit board.

As the industry moves towards thinner packages and packages containing chips of larger size for higher volumetric packaging, new packaging techniques are evolving. One such technique is the lead on chip package, (LOC). As described in U.S. Pat. No. 4,862,245 to Pashby et al., issued Aug. 29, 1989, and in U.S. Pat. No. 4,916,519 to Ward, issued Apr. 10, 1990, and in the article entitled *Volume Production of Unique Plastic Surface Mount Modules For The IBM 80-ns 1-Mbit DRAM Chip by Area Wire Bond Techniques* by William C. Ward, published at the 38th ECC in IEEE 1988, pages 552–557, this technique disposes a lead frame over the active area of an integrated circuit. Adhesive insulating tape attaches the lead frame to the integrated circuit chip. Wire bonds connect the circuit to the centrally disposed power supply busses. And, wire bonds jump over the power supply busses to connect the integrated circuit to conductive lead fingers. No chip support pad is required.

Concerns exist about potential wire bond shorting to the power bus portions of the lead frame in the LOC package. Since the wires to the signal pins cross the metal lead frame power bus, the opportunity for shorting may arise from assembly processes such as poor bond location, wire loop control, mold compound sweep, or from accidental touching during processing. These assembly process also create concerns about shorting between the wirebonds themselves.

One approach to minimize shorting problems suggests the use insulated wire. See, *Insulated Aluminum Bonding Wire For High Lead Count Packaging* by Alex J. Oto, International Journal For Hybrid Microelectronics, Vol. 9, No. 1, 1986. While insulated wire has been reported to have some degree of success in conventional assembly packages, the successful implementation in a LOC package is questionable due to the nature of the wire bond stitch as it occurs over the insulating film on top of the integrated circuit; the probability of successful implementation is therefore less likely. Additionally, insulated wire is expensive.

It is an object of this invention to provide a solution to wire bond shorting in lead on chip integrated circuit packaged devices.

Other objects and benefits of this invention will be apparent to those of ordinary skill in the art having the benefit of the description to follow herein.

SUMMARY OF THE INVENTION

A conductive tape for a packaged semiconductor device is disclosed. The tape contains a first adhesive layer, a base film on top of the first adhesive layer, a conductive layer on top of the base film layer, and a second adhesive layer on top of the conductive layer. Metal may form the conductive layer. The tape may have slits, slots, or apertures in it so that electrical connection may be made to the conductive layer. Such a tape is useful in lead on chip integrated circuit packages to connect the semiconductor die to the lead frame and to function as a power supply bus by transferring power to the semiconductor die. Wire bonds extending through slots in the second adhesive layer form electrical connection from the lead fingers for receiving power to the conductive layer of the tape. Wire bonds extending from the bonding pads of the semiconductor through slots the second adhesive layer form electrical connection from the semiconductor die to the conductive layer.

BRIEF DESCRIPTION OF THE DRAWINGS

FIG. 1 is a cross section view of a typical integrated circuit package.

FIG. 2 is a perspective, exploded view of a lead on chip center bond device illustrating the lead frame, adhesive tape, and integrated circuit.

FIG. 2a is a top view of the lead on chip center bond device illustrating the connection of the integrated circuit chip thereunder.

DETAILED DESCRIPTION OF SPECIFIC EMBODIMENT

Figure 2B:
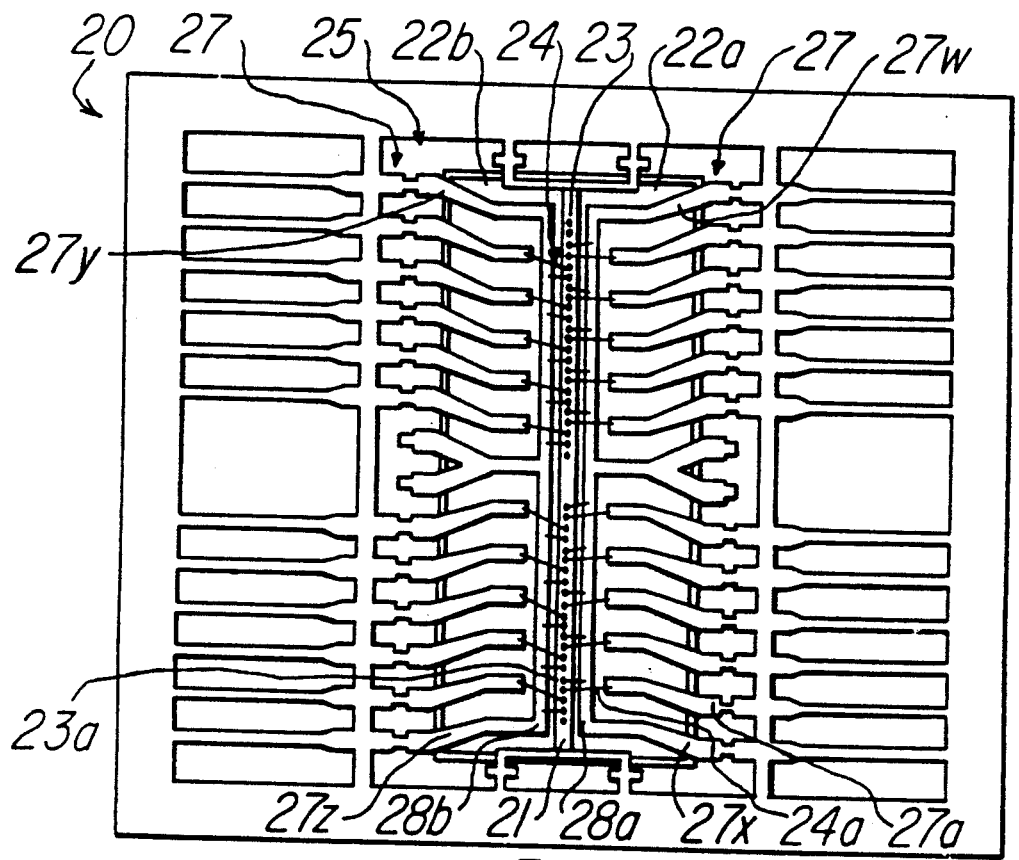
FIG. 2b is a top view of the lead on chip center bond device illustrating the connecting wire bonds.

FIG. 1 illustrates an integrated circuit packaged device 10 constructed in the industry standard plastic small outline J-leaded (PSOJ) surface mount package. A semiconductor integrated circuit chip 11 rests on a mount support pad (chip attach) 12. Wire bonds 14 connect the bonding pads (not shown) located along the outer edges of semiconductor circuit 11 to conductive "J" shaped lead fingers 15. A mold compound material 16 such as plastic encapsulates the components.

FIG. 2 illustrates an initial stage of the LOC concept. The following copending and coassigned applications also describe the LOC concept:

| Serial No. | Inventor | Filed | TI-Docket |
|---|---|---|---|
| 373,742 | Heinen, et al. | 06/30/89 | 14287 |
| 455,210 | Lim, et al. | 12/22/89 | 14600 |

| Serial No. | Inventor | Filed | TI-Docket |
| --- | --- | --- | --- |
| 455,105 | Lim. et al. | 12/22/89 | 14603 |

In packaged device 20 of FIG. 2, the bond pads 23 lie along the central horizontal axis of semiconductor integrated circuit chip 21. Semiconductor 21 lies beneath lead on chip lead frame 25. Lead on chip lead frame 25 may be formed of conductive metal. An example is full hard temper CDA alloy 151 about 0.008 inches thick that may be spot plated in gold, silver, or the like. Another example is half hard alloy 42. Semiconductor chip 21 may be, for example, a 16 Megabit Dynamic Random Access Memory (DRAM) storing more than 16 million data bits on a semiconductor substrate about 325×660 mils. Two pieces of double sided adhesive tape 22a and 22b are disposed over the top active surface of semiconductor circuit 21 and attach lead frame 25 over the top of chip 21. It is this configuration that leads to the description "lead on chip", (LOC). The centrally disposed bond pads 23 lead to the further description "lead on chip center bond", (LOCCB). Double sided adhesive tape 22a and 22b may comprise, for example, a double sided thermosetting epoxy adhesive coated polyimide film that also acts as an active barrier. One such commercially available polyimide film is sold under the trade name "Dupont Kapton". The chip 21 and the lead frame 25 form a self supporting structure. No chip support pad is required.

FIG. 2a depicts the resulting structure when the lead frame 25 is affixed over the integrated circuit 21 in the manner shown in FIG. 2. The power busses 28a and 28b are part of the lead frame material and comprise spaced apart parallel conductive busses that run along the middle of the chip 21. Power supply bus 28a is connected between lead fingers 27w and 27x and may provide, for example, ground voltage Vss. Power supply bus 28b is connected between lead fingers 27y and 27z and may provide, for example, positive voltage Vdd. The adhesive tapes 22a and 22b are spaced apart such that the bond pads 23 of chip 21 are exposed for bonding to the conductive lead fingers 27 of lead frame 25.

FIG. 2b illustrates a subsequent assembly stage of packaged device 20 wherein high speed thermosonic gold ball wire bonding is accomplished to connect the bond pads 23 to various lead fingers 27 and to the power supply busses 28a and 28b. While various types of wire bonding may be utilized, gold wire bonds of about 0.001 inches diameter are sufficient. One end of the wire bonds 24 are connected to various of the bond pads 23. The other end of various wire bonds 24 are connected to the two centrally disposed power supply busses 28a and 28b of lead frame 25. Multiple wire bond contacts may be made to these busses to more efficiently distribute voltage. The other end of various wire bonds 24 cross over a power supply bus to make contact with the internal ends of the conductive lead fingers 27. Wire bond 24a is exemplary. One end of wire bond 24a is attached to the internal end of lead finger 27a. Wire bond 24a passes over power supply bus 28a where the other end of wire bond 24a is connected to bond pad 23a. An undesirable wire sweep could result in wire bond 24a touching power supply bus 28a thereby causing an undesirable short.

Figure 2E:
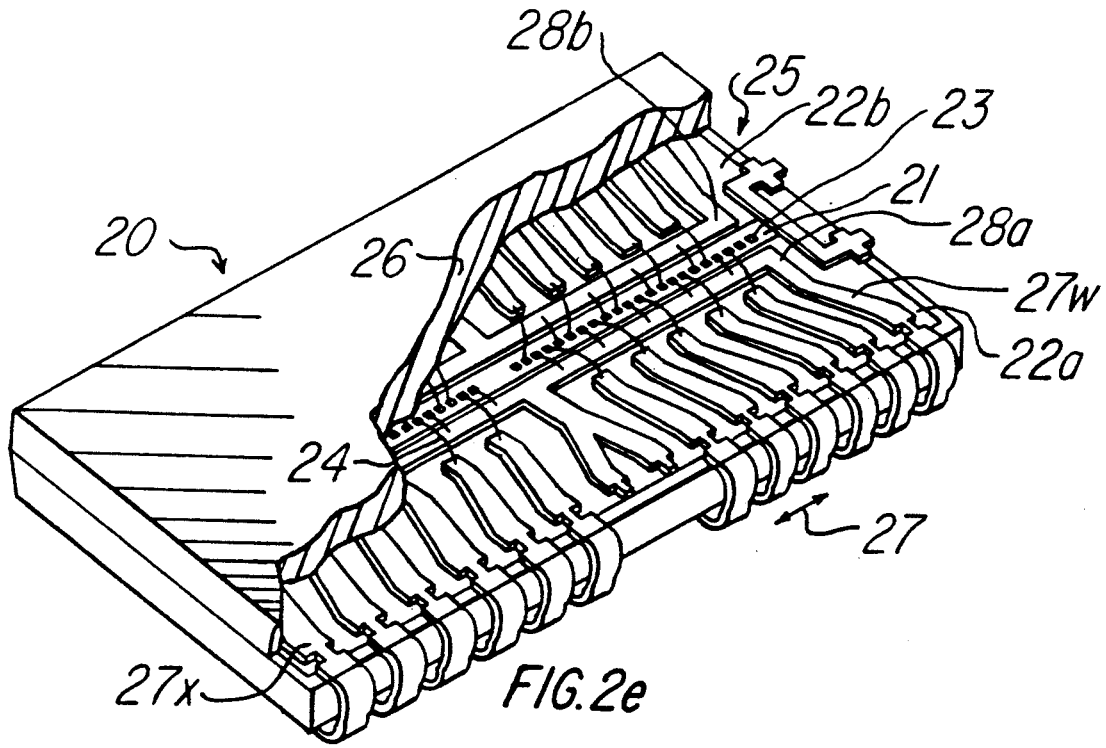
FIG. 2e is a perspective view, partially broken away, of the completed lead on chip center bond integrated circuit package.
Figures 2C, 2D:
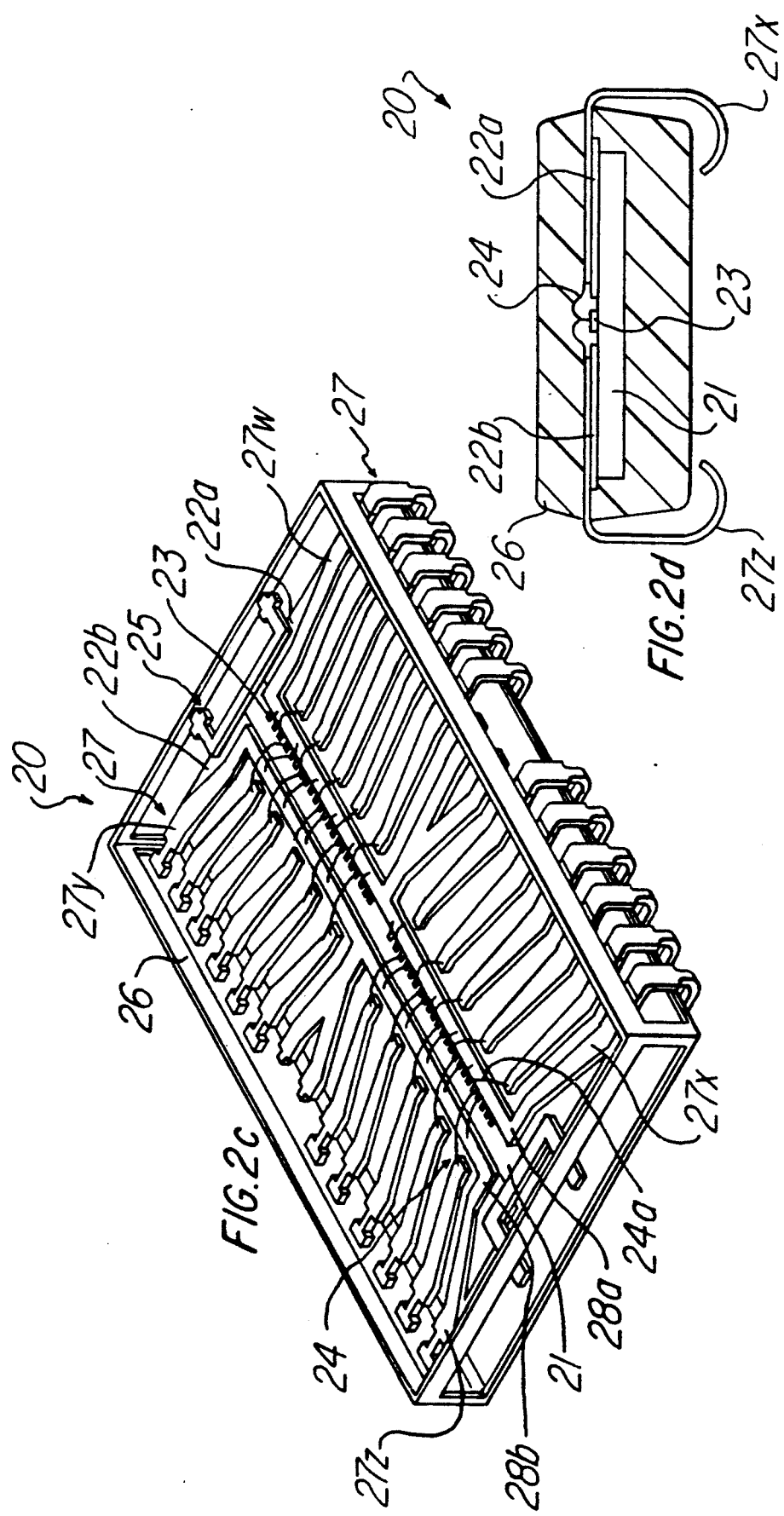
FIG. 2c is a top view of the lead on chip center bond device wherein the encapsulating mold compound is rendered transparent.
FIG. 2d is a side view of the completed lead on chip center bond package.

FIG. 2c illustrates packaged device 20 in a subsequent assembly stage with the plastic encapsulant 26 rendered transparent. Transfer molding is accomplished using a molding compound such as a Novolac epoxy. Low stress mold techniques work well in encapsulating the device. The plastic encapsulant 26 surrounds the integrated circuit 21, the lead frame 25, and the wire bonds 24 to form a plastic body. The lead frame 25 is trimmed and the lead fingers 27 are bent in the "J" shape with the outer lead finger ends extending through the plastic encapsulant 26 so that suitable physical and electrical connection may be made with external circuitry. There are 24 lead fingers 27 extending through the plastic encapsulant.

FIG. 2d is a side view of the completed lead on chip packaged device 20. The package size for the die size above described may be on the order of about 400×725 mils and may be thinner than about 50 mils. The external appearance of the package is that of a 24 pin PSOJ.

FIG. 2e illustrates in perspective a partially cut away view of the finished semiconductor packaged device package 20.

Figure 3:
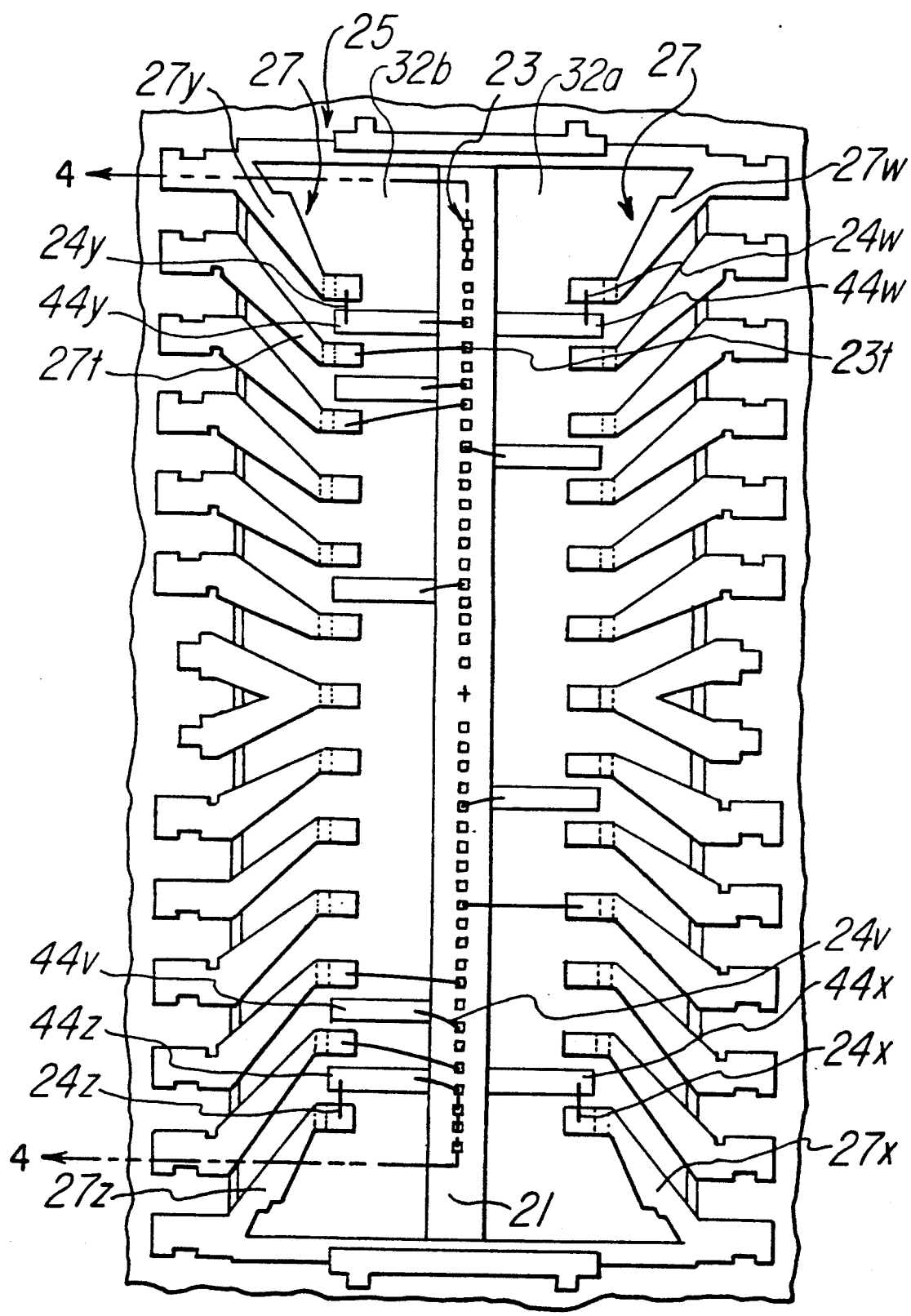
FIG. 3 is partial broken away top view of FIG. 2b, altered to illustrate the preferred embodiment of the invention.
Figure 4:
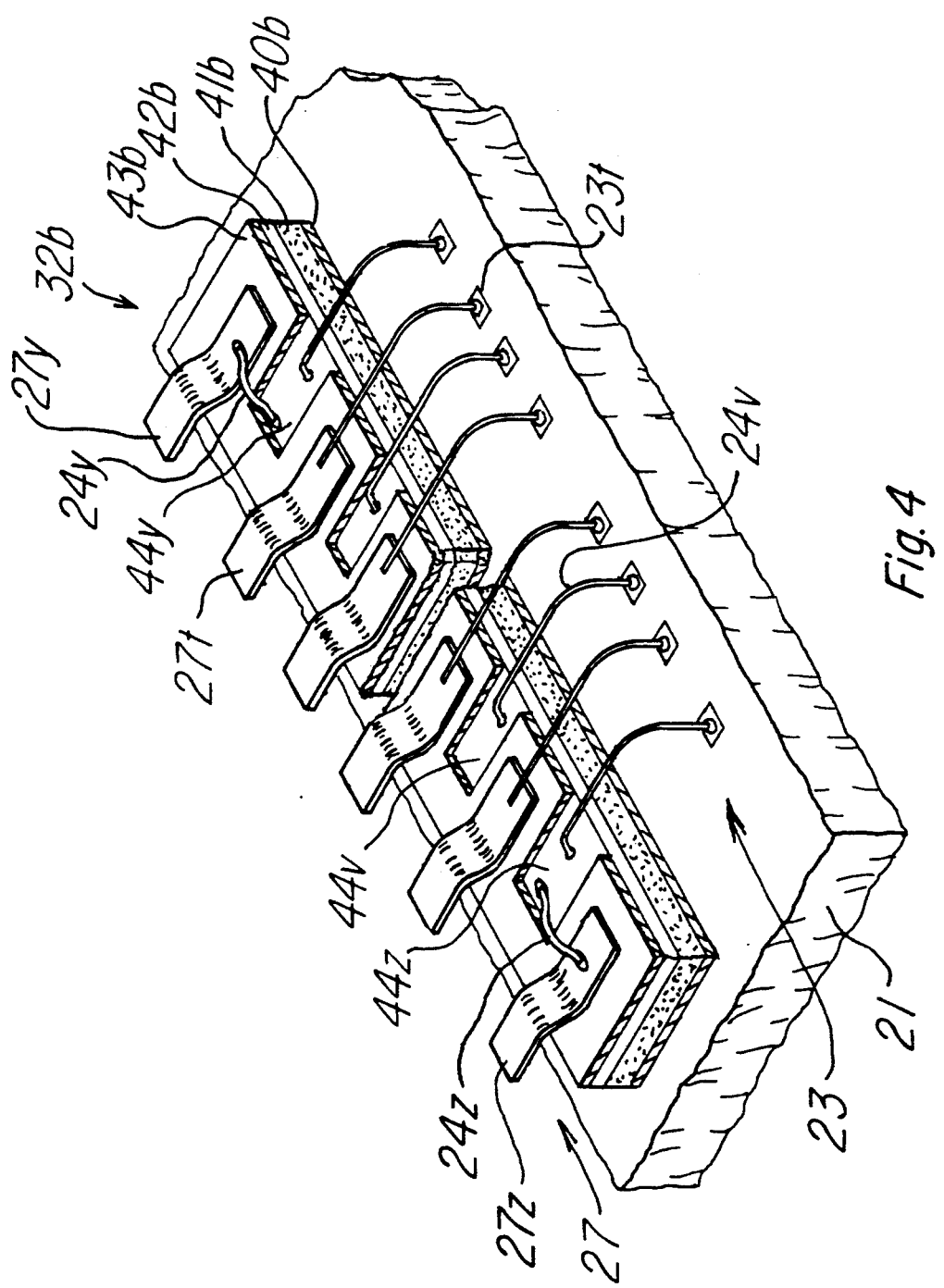
FIG. 4 is a perspective view of the preferred embodiment of the invention taken along the line 4—4 of FIG. 3

FIG. 3 is a partial broken away top view of FIG. 2b, altered to illustrate the preferred embodiment of the invention, while FIG. 4 is a perspective view along the line 4—4 of FIG. 3 to further illustrate the preferred embodiment of the invention. (The lead frame 25 is broken away from its outer edges and for clarity, only a few wire bonds are illustrated.) In FIGS. 3 and 4, the double sided adhesive tape 32 is different and improved over the double sided adhesive tape 22 of FIG. 2 et al. The double sided adhesive tape 32 contains a metallization layer 42 that conducts power. This difference results in the elimination of the lead frame power supply bus portions 28a and 28b.

Referring to FIG. 4, the double sided adhesive tape 32b is advantageously comprised of four layers: an adhesive layer 40b adjacent to the semiconductor chip 21; a base film layer 41b on top of the adhesive layer 40b; a metallization layer 42b on top of the base film layer 41b; and, an adhesive layer 43b on top of the metallization layer 42b, adjacent to the underside of the inner tip portions of lead fingers 27. Metallization layer 42b may be composed of aluminum, copper, half hard alloy 42, or any such material suitable for wire bonding. In the preferred embodiment, metallization layer 42b is formed of half hard alloy 42. It may range from approximately 0.001 inches to 0.004 inches in thickness, although in the preferred embodiment, it is 0.002 inches thick. Examples of suitable adhesives for adhesive layer 40b and adhesive layer 43b include acrylics, silicones, epoxies, and polyimides. In the preferred embodiment, adhesive layers 40b and 43b are polyimides. Base film layer 41b is an alpha barrier polyimide film. In the preferred embodiment, base film 41b is the "Dupont Kapton" polyimide film.

In FIGS. 3 and 4, adhesive layer 43b of tape 32b has portions 44 cut out or removed from it so that electrical connection may be made from the lead fingers 27 and the bonding pads 23 to metallization layer 42b. These removed portions resemble slots, cut into and along the tape edge near the bonding pads. They extend into the tape between the lead finger 27 inner end tips. They function as apertures, allowing electrical connection to metallization layer 42b of metallized tape 32b. Wire bond 24z extends into cut out area 44z of tape 32b and connects the inner tip portion of lead finger 27z to metallization layer 42b. Wire bond 24y extends into cut out area 44y of tape 32b and connects the inner tip portion of lead finger 27y to metallization 42b. The outer end portions of lead fingers 27z and 27y will extend through the encapsulated package, not illustrated, for connecting to external Vdd. In this fashion, metallization layer 42b of tape 32b will provide Vdd to those bonding pads 23 connected to it by other wire bonds 24. For example, wire bond 24v extends into cut out area 44v of tape 32b and connects the bonding pad 30v to metallization layer 42b. Other bonding pads are directly wire bonded to their respective lead fingers as in FIGS. 2 et al. The bond pad 24t connection to lead finger 27t is one example.

Tape 32a of FIG. 3 is constructed the same as tape 32b and is similarly connected between lead fingers 27w and 27x so that its metallization layer 32a carries Vss.

Thus, the conductive tape is useful in lead on chip integrated circuit packages to connect the semiconductor die to the lead frame and to function as a power supply bus by transferring power to the semiconductor die. Wire bonds extending through slots in the second adhesive layer form electrical connection from the lead fingers for receiving power to the conductive layer of the tape. Wire bonds extending from the bonding pads of the semiconductor die through the slots of the second adhesive layer form electrical connection from the semiconductor die to the conductive layer. Wire bond shorting to the power supply bus portions of the conventional lead on chip lead frame is eliminated.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A conductive double sided adhesive tape adapted for use in a lead on chip integrated circuit packaging arrangement, the arrangement including an integrated circuit chip with a top surface having a length and opposed sides, the top surface presenting bond pads arranged along the length of the top surface and substantially centered between the sides of the top surface, individual lead frame fingers, which are conductive, extending over the top surface adjacent the bond pads, and bond wires extending between the bond pads and the fingers, the tape comprising:

a first adhesive layer adapted to be mounted on the top surface of the integrated circuit;
   a base film layer on top of the first adhesive layer;
   a conductive layer on top of the base film layer; and
   a second adhesive layer on top of the conductive layer, the second adhesive layer being adapted to mount the lead frame fingers to the tape and insulate the lead frame fingers from the conductive layer, the second adhesive layer also presenting apertures to the conductive layer adapted for connection of bond wires between the bond pads and the conductive layer,
   the four layers being formed into a substantially rectangular shape with a length less than that of the top surface of the integrated circuit and a width less than the distance between the bond pads and one side of the top surface.

2. The tape of claim 1 in which the conductive layer is continuous across the length and width of the tape.

3. The tape of claim 1 in which the apertures to the conductive layer are adapted to be located between the lead frame fingers.

4. The tape of claim 1 in which the apertures to the conductive layer are adapted to be located between the lead frame fingers and the apertures extend to one lateral margin of the tape.

5. The tape of claim 1 in which at least one of the apertures to the conductive layer is adapted to be located adjacent a lead frame finger for connection of a bond wire between the at least one aperture and the adjacent finger.

* * * * *